Nov. 4, 1958 W. G. PFANN 2,859,142

METHOD OF MANUFACTURING SEMICONDUCTIVE DEVICES

Filed June 29, 1954 2 Sheets-Sheet 1

INVENTOR
W. G. PFANN
BY Arthur J. Torsiglieri
ATTORNEY

Nov. 4, 1958 W. G. PFANN 2,859,142

METHOD OF MANUFACTURING SEMICONDUCTIVE DEVICES

Filed June 29, 1954 2 Sheets-Sheet 2

INVENTOR
W. G. PFANN
BY Arthur J. Torsiglieri
ATTORNEY 2,859,142
Patented Nov. 4, 1958

2,859,142

METHOD OF MANUFACTURING SEMICONDUCTIVE DEVICES

William G. Pfann, Basking Ridge, N. J., assignor to Bell Telephone Laboratories, Incorporated, New York, N. Y., a corporation of New York Application June 29, 1954, Serial No. 440,151
9 Claims. (Cl. 148—1.5)

This invention relates to methods for the manufacture of semiconductive devices.

A broad object of the present invention is to reduce the cost of the manufacture of such devices.

To this end, a more specific object is to adapt the process of manufacture of such devices to techniques which readily make possible mass production of such devices.

Similarly, other related objects are to minimize the number of steps necessary in the manufacturing process whereby costs are reduced and to reduce in the process of manufacture the waste of semiconductive material which is generally quite expensive. Semiconductive material as used herein is electronic conductive material with resistivity in the range between metals and insulators, in which the electrical charge carrier concentration increases with increasing temperature over some temperature range.

Another object is to provide a novel process which is readily adaptable to the manufacture of semiconductive devices of the small size necessary for operation at high frequencies.

In semiconductive devices of primary interest, the semiconductive body which is the active element of the device contains at least two regions of different conductivity type defining a p–n junction and at least two electrodes in intimate contact with said body. The construction of such devices has hitherto involved a series of steps. Usually there is first formed a crystal of the semiconductive material of a size many times that desired for the semiconductive body of a single device and having a desired conductivity-type distribution. This crystal is thereafter cut up into minute individual wafers of a size corresponding to that desired for the semiconductive body. Typically an individual wafer will have dimensions which are all small fractions of an inch. This involves considerable cutting, grinding and etching which are tedious steps since they must be done with precision and which also result in considerable waste of semiconductive material. Usually, there follows a series of additional steps, culminating in the attachment of the necessary fragile electrodes to specific minute regions of the tiny semiconductive wafers. Moreover, because of the small size of the semiconductive wafers and the necessity for precision, much of the work must be done while the wafers are viewed through microscopes. It can be appreciated that such work is laborious. Additionally, because of these same factors, elaborate jigs are necessary to insure the accurate positioning of electrodes to the wafers. For these and various other reasons such methods do not readily lend themselves to mass production techniques and make difficult a low unit cost for semiconductive devices.

The present invention, on the other hand, provides a method which combines the functions of the principal steps outlined above as well as the other necessary steps into a few basic steps which do lend themselves to mass production techniques.

To this end, the principal features of the process forming the present invention are the steps of dipping an appropriately designed electrode assembly into a molten mass of semiconductive material and then withdrawing it along with a small controlled amount of molten semiconductive material which is held by interfacial tension between the elements of the electrode assembly. This molten material is then allowed to solidify advantageously in a manner to favor the formation of a single crystal body extending between the electrode elements. The desired distribution of different conductivity-type regions in the semiconductive body is achieved, for example, by appropriate preliminary treatment of the ends of the elements of the electrode assembly which make contact with the semiconductive body formed.

Other subsidiary features include associating with at least one element of the electrode assembly significant impurity solutes characteristic of a conductivity-type opposite to the conductivity type in the solid state of the molten semiconductor so that during solidification the diffusion of such solutes into, or the contact with, adjacent portions of the semiconductive body will cause a conversion in conductivity-type of this portion whereby a p–n junction is formed in the body; and maintaining a temperature gradient along the material uplifted during solidification to enhance solidification in a single direction whereby the material solidifies in monocrystalline form.

Various other features will be described in connection with the following more detailed description which is to be read in conjunction with the accompanying drawing in which.

Figure 1A:
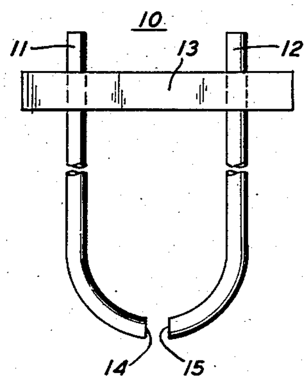
Figs. 1A, 1B and 1C show successive stages in the process of forming a p–n diode in accordance with the invention.

Referring now more particularly to the drawings, in Fig. 1A the illustrative electrode assembly 10 shown comprises two elements 11, 12 which are supported in an insulating base member 13, which, for example, can be of glass or a suitable refractory material. As shown, each of the two elements 11 and 12 has a straight portion which extends through the insulating support body 13 and an arcuate end portion. Of course, various other shapes are feasible. The two arcuate end portions are curved towards one another and the end faces 14, 15 thereof are spaced apart a distance which will determine the length of the semiconductive body to be formed on the electrode assembly. This separation can range from a fraction of a mil to tens of mils. In the embodiment shown, the end faces 14, 15 are planar and parallel to one another. In some instances, alternative configurations for the end faces may be more advantageous. In particular, as will be described in more detail later, solidifying in a preferred direction may be enhanced by appropriate choice of the relative sizes of the electrodes. The particular electrode assembly shown has the advantage that it can be readily formed by cutting through the middle of a U-shaped element.

Each of the two electrode elements advantageously is of a metal which has a melting point higher than that of the semiconductive material which is to form the body of the diode. Where germanium or a germanium-silicon alloy is to be the semiconductive material, molybdenum, tantalum and tungsten, for example, are metals with suitable melting points of which to form the electrode elements. It may also be important where the semiconductive body is to be of appreciable length to provide that the expansivity coefficients of the electrode material be related to that of the semiconductive material in a manner to avoid internal stresses in the semiconductive body after solidification. For the manufacture of devices in which germanium is the semiconductor, molybdenum is a suitable material in this respect also since its expansivity coefficient is close to that of germanium. However, in many cases the dimensions of the semiconductive body will be so small that it should be unnecessary to match the expansivity characteristics closely.

The electrode elements themselves are shown, for example, simply as wires of circular cross section of a size to have their end faces form suitable electrode connections to the semiconductive body. Also it is usually desirable for avoiding unnecessary complications to have the electrode elements of sufficient mechanical strength to support the semiconductive body. Of course, techniques can be used to reinforce such wires after formation of the semiconductive body thereon, such as the use of a resin setting.

To minimize waste of semiconductive material, to improve the uniformity of characteristics, and to achieve a control on dimensions, it is desirable that only the end faces, or selected portions, of the elements be wet by the molten semiconductor. To this end, all but the end faces of the two elements 11, 12 are made non-wettable by some appropriate treatment, such as carbonizing, oxidizing, glazing with a suitable material, or coating with a silicone.

It is also important to prepare the end faces of the electrode elements so that each will affect the region of the semiconductive body withconductive body with which it will be in contact in a particular manner. For forming a p-n diode, for example, one electrode element should have associated with it a donor impurity, while the other an acceptor impurity.

Various techniques are possible to achieve this. One particular technique is to form each electrode element of the same material but to coat the end faces with appropriate significant impurities for diffusion into the associated regions of the semiconductive body during solidification. An alternative technique is to form the two electrode elements of different material having opposite significant impurity characteristics. Typically one may be of a molybdenum alloy which includes an acceptor such as indium, copper, boron, aluminum, gallium or thallium, the other a molybdenum alloy which includes a donor such as antimony, phosphorus, lithium or arsenic. Doping from such elements into the semiconductive body can be accomplished in several ways. For the moment there will be mentioned only the case in which the concentration, solubility and diffusivity characteristics of the significant impurities in the alloy are such that sufficient diffusion of the impurities for effecting the desired changes in conductivity type occurs during solidification without need for further treatment.

There is prepared a molten mass of highly purified semiconductive material which is kept in a suitable non-contaminating crucible which, for example, is of graphite. In Fig. 1B there is shown a crucible 17 within which is a molten mass 18 of purified germanium which has been made N type by doping with a suitable donor. The purified germanium can be prepared, for example, by zone refining in the manner described in my copending application Serial No. 256,791, filed November 16, 1951, now Patent No. 2,739,088, granted March 20, 1956. This crucible is shown enclosed within a quartz bell jar 20 through which some suitable inert gas, such as helium, hydrogen or nitrogen, is passed by way of inlet 19A and outlet 19B. The use of an inert atmosphere in this way minimizes contamination and the formation of oxides. Additionally, the gas serves as a coolant to accelerate solidification of material removed from the melt. The crucible 17 is heated by means of water-cooled coils 21 through which are passed for induction heating radio frequency currents supplied by a source not here shown.

For forming a p-n diode, the two-element electrode assembly 10 shown in Fig. 1A is touched to the surface of, or barely immersed in, the molten germanium as shown in Fig. 1B.

To this end, the electrode assembly 10 is supported by its base to one end of a suitable dipping mechanism 22 which, when actuated, lowers the electrode assembly so that the ends of the electrode elements are immersed in the molten semiconductor and then raises it to lift the ends of the electrode elements free of the molten mass withdrawing the semiconductor held between the two faces of the electrodes. The dipping mechanism 22 can take a variety of forms so that only a very schematic arrangement is here shown. In particular, it can be appreciated that for mass production, this can be made a continuous process. To this end, each of a succession of electrode assemblies, all suitably supported from a moving cable, can be dipped in turn automatically as the cable carries each past a crucible of molten semiconductor. Additionally, arrangements may be devised for dipping a multiplicity of assemblies simultaneously.

The molten germanium wets the end faces of the two elements forming the electrode assembly. The two faces are so closely spaced that the surface tension forces of the molten germanium, together with various cohesive forces present, forms a continuous region of germanium between the two faces. The ends of the electrode elements preferably are kept in contact with the molten germanium no longer than necessary to form a continuous body 16 between the two faces to minimize contaminating the melt from the significant impurities associated with the end faces of the electrode elements. When the electrode elements are withdrawn from the melt they will take with them the molten germanium held by interfacial tension between their two end faces. This molten germanium is allowed to cool to form a solid germanium body supported between the two electrode elements.

It is usually desirable that the germanium body be monocrystalline. To promote solidification in single crystal form, it is advantageous that the germanium body solidifies in a single direction. To this end, it is advantageous to establish a temperature gradient along the material uplifted in a manner that solidification will start at the cooler end and progress towards the other end. When this is done, it is important that the segregation of impurities resulting during solidification enhance the desired distribution of significant impurities in the body. In particular, it is within the spirit of another embodiment of the invention to achieve the desired distribution of impurities along the body by segregation, thus obviating the need for associating significant impurities with the end faces of the electrode elements. The principles of achieving p–n junctions in semiconductors by segregation are set forth in detail in an article published in the Journal of Metals, volume 4 (1952), pp. 861–865. In particular, the melt should include two impurities of opposite conductivity type and different segregation coefficients.

Moreover, for facilitating solidification in monocrystalline form it is desirable that the solidification start at a point or at as small a region as possible. To this end, it is desirable that solidification be started at the surface adjacent the electrode having the smallest contact area. A factor facilitating this is that the smaller end of the semiconductive body normally has a tendency to cool first because of its smaller thermal mass. Solidification in this fashion can be further encouraged by having the electrode at which solidification is designed to begin at a temperature lower than the other electrode and by withdrawing this end of the semiconductive material trapped first from the melt. In some cases the rate of withdrawal can advantageously be made close to the rate of solidification.

As a practical matter, although monocrystalline semiconductive bodies are preferable for high quality units since their characteristics are more apt to be uniform from unit to unit, for many applications polycrystalline units are satisfactory. The great economies effected by manufacture in accordance with the invention make tolerable some additional expense in sorting and testing the units. Accordingly, even though some twinning or multiple nucleation may result during solidification in some units such an occurrence need not make useless such units.

During solidification the acceptor impurities on one face diffuse into the adjacent region of the germanium body and convert it to p-type. The donor impurities on the other face diffuse into the adjacent region of the germanium body and insure that the acceptor impurities diffused in from the opposite face do not convert the entire body to p-type. Additionally, the presence of the donor impurities on the one face facilitates making good ohmic connection between that face and the n-type germanium body. However, if other precautions are taken to insure that the acceptor impurities which are encouraged to diffuse into the n-type body are not permitted to convert the entire body to p-type, the need for donor impurities on the one face may be eliminated.

Figure 1C:
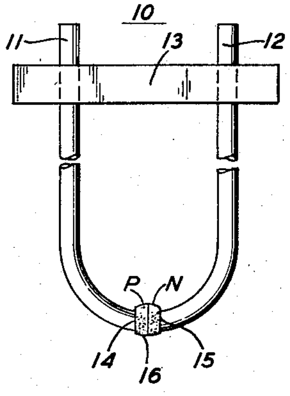
Figure 1B:
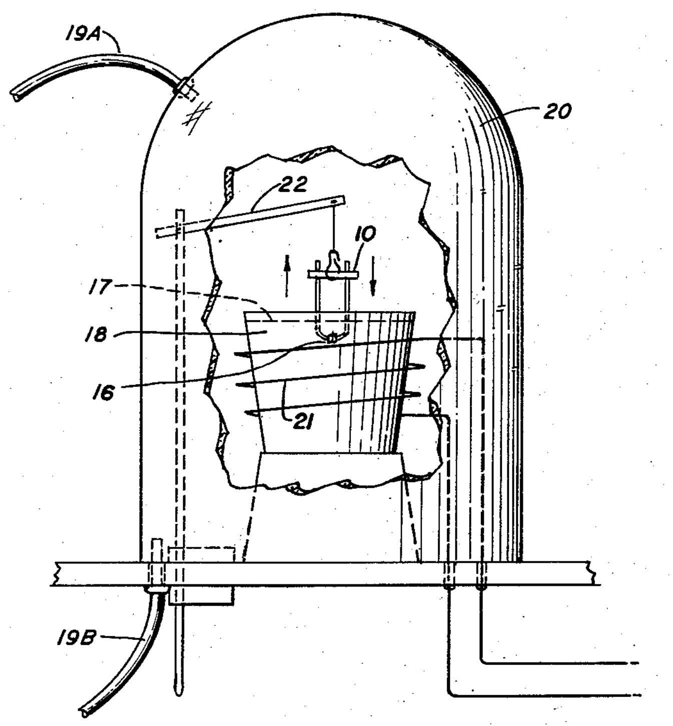

Fig. 1C shows the diode after solification of the molten germanium. It comprises a germanium body 16 which includes adjacent p- and n-type regions defining a p-n junction and separate electrode connections 14 and 15 to the p- and n-type regions. Typically, such a unit can have a circular cross section with a diameter of 10 mils and a length of 5 mils, of which about 1.5 mils is n-type and 3.5 mils p-type.

After the diode has solidified, it is advantageous to treat the semiconductive body in the manner hitherto used on semiconductive devices to stabilize its properties, minimize humidity and other atmospheric effects, and reduce surface recombination. Such treatment may include etching, the deposit of a protective coating, and hermetic sealing in a container.

It was suggested above that it may be unnecessary to have the impurities associated with the electrode elements diffuse into the semiconductive body only during dipping and solidification. For example, in one modification of the described process the electrode elements are of alloys which include significant impurities which have a low diffusivity rate. Then after solidification, the unit can be further heated at temperatures below the melting point of the semiconductor, but high enough for diffusion of the impurities from the electrode elements for extended intervals during which the significant impurities in the electrode elements diffuse into adjacent portions of the semiconductive body for forming a p-n junction in the body. This modification offers the advantage of reducing the contamination of the melt resulting from the dipping of doped electrode elements therein. Suitable for use in this way is an electrode of a copper alloy for forming p-type zones. Copper in germanium has a very small distribution coefficient so that the immersing process will little contaminate the n-type germanium melt. However, after the germanium body formed on the electrodes has solidified, further heating at temperatures below the melting point of the germanium will act to diffuse copper into the solid germanium with a resultant change to p-type conductivity. Similarly, molybdenum electrodes having their ends doped by the diffusion therein of suitable acceptor or donor impurities by heat treating in the presence of such impurities in a vapor state can be used in this way.

Figure 2:
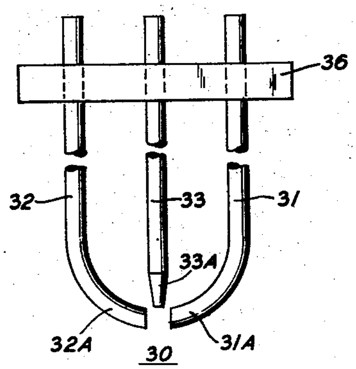
Figs. 2, 3 and 4 show alternative forms of three-element electrode assemblies for use in forming p–n–p or n–p–n junction-type transistors in accordance with the invention.

The methods described above for forming a p-n diode can readily be extended to the manufacture of n-p-n and p-n-p transistor structures. For such structures, there is utilized an electrode assembly having three elements corresponding to the emitter, collector and base electrodes of a transistor. Fig. 2 shows an electrode assembly 30 housed in an insulating base support 36 including a pair of elements 31 and 32 which curve towards one another at their ends 31A, 32A. These correspond, respectively, to the emitter and collector electrodes. Additionally, a third element 33 corresponding to the base electrode extends from the support 30 and has an end 33A which extends close to the gap formed between ends 31A and 32A. The end 33A is positioned to make connection along only an intermediate portion of the semiconductive body to be formed between the ends 31A and 32A. In the particular configuration illustrated, the faces of ends 31A and 32A are shown parallel and planar, while the face of end 33A is shown pointed or wedge-shaped. Various alternative configurations are feasible. For example, in Fig. 3 there is shown an electrode assembly 40 in which the element 43 corresponding to the base electrode has an end 43A which forms a closed circular loop surrounding the gap formed between the planar circular end faces 41A and 42A of elements 41, 42, which correspond to the emitter and collector electrodes. Additionally, in Fig. 4 there is shown an electrode assembly 50 including two long straight electrodes 51, 52 and a shorter intermediate electrode 53, each supported from an insulating base 54. A non-wetting coating 55 is applied to the surfaces of all of the electrodes except for short regions of the inner surfaces of electrodes 51 and 52 and the end region of electrode 53.

Figure 3:
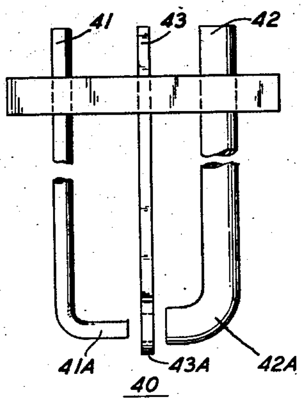
Figure 4:
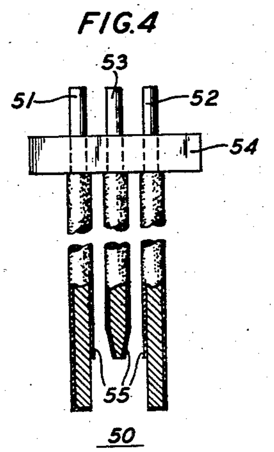

For use with electrode assemblies of the kinds shown in Figs. 2 through 4 in forming transistor structures, there is prepared advantageously a melt of semiconductive material which in the solid state has a conductivity type similar to that desired for the base region of the transistor. Accordingly, for a p-n-p transistor, the melt would be n-type, while for an n-p-n transistor, the melt would be p-type. In accordance with such a preferred practice of the invention, the emitter and collector electrodes have associated with them significant impurities associated with a conductivity-type opposite that characteristic of the melt, while the base electrode has associated with it a significant impurity of the same conductivity type as characterizes the melt. The significant impurities can be associated with the electrode elements in any of the ways described above in connection with the forming of a p-n diode. For example, for fabricating a p-n-p transistor, the emitter and collector electrodes can be an alloy of indium and molybdenum while the base electrode can be an alloy of antimony and molybdenum. By associating with the base electrode, significant impurities of conductivity type similar to that which characterizes the melt, there is facilitated making a good low resistance ohmic connection to the semiconductive body, a factor which is important for electrical stability, and there is also minimized the possibility of the formation of a continuous region of one conductivity type between the collector and emitter electrodes.

Alternatively, the base electrode can have associated therewith an impurity characteristic of a conductivity type opposite to that of the melt, and the emitter and collector electrodes an impurity characteristic of the same conductivity type as the melt.

The various electrode elements are made non-wettable in the melt at all but selected portions of their surfaces in the manner described earlier. Upon immersion in the melt, molten semiconductive material is held by interfacial tension between the emitter and collector electrodes, rising high enough to wet the base electrode.

Again, it is usually desirable in the interest of uniformity from element to element that the semiconductive body be monocrystalline so that solidification in a single direction becomes important. The various considerations described above are similarly applicable here. To this end, the electrodes are graded in size so that each will have a different cooling effect on the molten semiconductor trapped therebetween. For high frequency applications it is important to have the collector junction of the smallest area so that the collector electrode is made of smallest size. For such a case, the emitter contact 31A is made of largest size and the base contact 33A of intermediate size, and the emitter and collector electrodes 31 and 32 respectively, are preferably adjusted to be at the warmest and coolest temperatures before immersion. Additionally, the immersing process is arranged so that the collector portion of the semiconductive body is the first to emerge from the melt so that it starts freezing first. Various other expedients will be obvious to one skilled in the art to enhance solidification of the semiconductive body in monocrystalline form.

However, where high frequency applications are not of primary importance, it is preferable to have the collector junction of larger area than the emitter junction for a high alpha, i. e. so that a large fraction of carriers injected by the emitter will be collected by the collector. In such a case the emitter contact preferably is made of smaller area than the collector contact, and other appropriate changes are made to facilitate the progression of solidification from the smaller collector end to the larger emitter end of the semiconductive body.

Figure 5A:
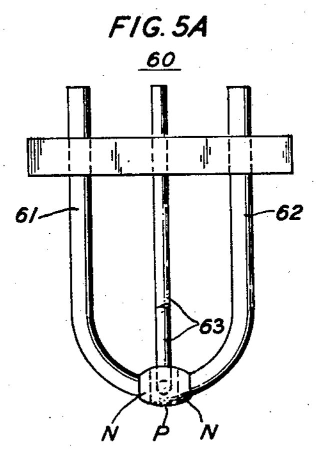
Figs. 5A and 5B show side and bottom views of a tetrode junction-type transistor formed in accordance with the invention.
Figure 5B:
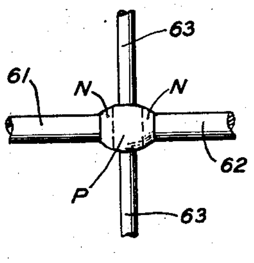

Similarly, the process described can be utilized for the manufacture of a tetrode transistor structure of the kind described in application Serial No. 294,298, filed June 19, 1952, by R. L. Wallace, Jr. now Patent No. 2,695,930, granted November 30, 1954. In such a tetrode structure, two distinct electrodes connect to the base region intermediate the emitter and collector regions. In the four-element electrode assembly 60 shown in Figs. 5A and 5B electrode elements 61, 62 correspond to the connections to the emitter and collector regions and elements 63, 64 correspond to the two connections to the base region. The general principles applicable are similar to those characteristic of the three-element structures described in connection with Figs. 2, 3 and 4. Each of electrode elements 63, 64 has associated with its end face to be in contact with the semiconductive body significant impurities of the same conductivity type as characterize the melt, while each of elements 61, 62 has associated with its end face significant impurities of opposite conductivity type. As shown, each of elements 61 and 62 has associated with it a donor material to form an n-type zone, and each of elements 63 and 64 an acceptor to form a p-type zone. Moreover, steps of the kind described can be employed to enhance solidification in a single direction to achieve monocrystalline form for the semiconductive body.

It is to be understood that the examples which have been described are merely illustrative of the general principles of the invention. For example, although only germanium has been mentioned above in connection with the semiconductive material forming the melt, silicon, germanium-silicon alloys, and compounds of group III and group V elements are also appropriate materials. Moreover, various other configurations can be manufactured by appropriate arrangements of electrodes. Additionally, various modifications and refinements in the basic process described will be obvious to workers skilled in the semiconductive and metallurgical arts without departing from the spirit and scope of the present invention.

What is claimed is:

1. The process of manufacturing a semiconductive device comprising the steps of wetting with molten semiconductive material the faces of at least two electrodes spaced apart so that surface tension forces form a continuous portion of the said molten semiconductive material between the said at least two electrodes, at least one of said electrodes having associated therewith a conductivity type determining impurity for said semiconductive material in amount sufficient to produce a conductivity region of semiconductive material adjacent said electrode, said conductivity region being of the same conductivity type as that of the said impurity, and solidifying the said portion.

2. The method of claim 1 in which the molten semiconductive material contains an excess of a conductivity type determining impurity of the type opposite to that of the said conductivity type impurity associated with the said at least one electrode.

3. The method of claim 1 in which the said conductivity determining impurity is of sufficient diffusivity to produce the said region during the said solidifying.

4. The method of claim 1 in which the said portion of semiconductive material is maintained in a heated state below its melting point subsequent to solidifying so as to permit further diffusion of the said conductivity determining impurity into the solid semiconductor material.

5. The method of claim 1 in which the said wetting is accomplished by immersing the said faces in the said semiconductive material, and in which solidifying is accomplished by withdrawing the said faces from the said molten material.

6. The method of claim 5 in which withdrawal of the said faces from the molten semiconductive material is carried out in such manner that at some time during the withdrawal at least one of the said faces is removed from the said molten material while at least one of the said faces remains immersed.

7. The process of manufacturing a semiconductive device comprising the steps of wetting the faces of a pair of spaced molydenum electrodes, alloyed with donor and acceptor impurities, respectively, with molten germanium for forming a continuous film of semiconductive material between said electrodes and solidifying the film for forming a semiconductive body between said faces which includes a p-n junction.

8. The process of manufacturing a semiconductive device comprising the steps of wetting with molten semiconductive material which when solid will be of one conductivity type the faces of two electrodes spaced apart so that surface tension forces form a continuous film between the two electrodes, one of said electrodes having associated therewith conductivity type determining impurities characteristic of the conductivity type opposite said one conductivity type in amount sufficient that the solid material solidifying adjacent such electrode will be of opposite conductivity type, and solidifying said film for forming a semiconductive body between said electrodes which includes a p-n junction.

9. The process of manufacturing a semiconductive device comprising the steps of preparing an electrode assembly having at least two electrodes, treating at least one of the electrodes to include therein a conductivity type determining impurity, wetting said electrodes with molten semiconductive material containing a conductivity type determining impurity of type opposite that associated with said treated electrode for forming a film between said electrodes, and solidifying said film for forming between said electrodes a semiconductive body including a p-n junction.

References Cited in the file of this patent

UNITED STATES PATENTS

| | | |
|---|---|---|
| 1,353,571 | Dreibot | Sept. 21, 1920 |
| 2,273,926 | Brannon | Feb. 24, 1942 |
| 2,671,264 | Pessel | Mar. 9, 1954 |
| 2,727,839 | Sparks | Dec. 20, 1955 |